(12) United States Patent
Wu et al.

(10) Patent No.: US 11,532,923 B2
(45) Date of Patent: Dec. 20, 2022

(54) VERTICAL-CAVITY SURFACE EMITTING LASER FOR EMITTING A SINGLE MODE LASER BEAM

(71) Applicant: National Taiwan University, Taipei (TW)

(72) Inventors: Chao-Hsin Wu, Taipei (TW); Szu-Yu Min, Hsinchu County (TW); Hao-Tien Cheng, Taipei (TW)

(73) Assignee: National Taiwan University, Taipei (TW)

( * ) Notice: Subject to any disclaimer, the term of this patent is extended or adjusted under 35 U.S.C. 154(b) by 261 days.

(21) Appl. No.: 16/932,839

(22) Filed: Jul. 20, 2020

(65) Prior Publication Data

US 2022/0021186 A1    Jan. 20, 2022

(51) Int. Cl.
   *H01S 5/183*    (2006.01)
   *H01S 5/042*    (2006.01)
   *H01S 5/343*    (2006.01)
   *H01S 5/22*     (2006.01)

(52) U.S. Cl.
   CPC ...... *H01S 5/18375* (2013.01); *H01S 5/04252* (2019.08); *H01S 5/04254* (2019.08); *H01S 5/18311* (2013.01); *H01S 5/18394* (2013.01); *H01S 5/2226* (2013.01); *H01S 5/343* (2013.01)

(58) Field of Classification Search
   CPC ............. H01S 5/18375; H01S 5/04252; H01S 5/04254; H01S 5/18311; H01S 5/18394; H01S 5/2226; H01S 5/343
   See application file for complete search history.

(56) References Cited

U.S. PATENT DOCUMENTS

| | | | |
|---|---|---|---|
| 6,320,893 B1 * | 11/2001 | Ueki | H01S 5/18355 |
| | | | 372/45.01 |
| 10,205,303 B1 * | 2/2019 | Hegblom | H01S 5/183 |
| 2015/0010031 A1 * | 1/2015 | Makino | G01N 21/4795 |
| | | | 372/45.01 |

FOREIGN PATENT DOCUMENTS

| TW | 201917967 A | 5/2019 |
|---|---|---|
| TW | 202025583 A | 7/2020 |

* cited by examiner

*Primary Examiner* — Yuanda Zhang
(74) *Attorney, Agent, or Firm* — Winston Hsu

(57) ABSTRACT

A vertical-cavity surface emitting laser includes a substrate, a first reflector, an active region, an oxide layer, a second reflector, and a circular metal electrode. The first reflector is formed above the substrate. The active region is formed above the first reflector, and includes at least one quantum well. The at least one quantum well generates a laser beam with a plurality of modes. The oxide layer is formed above the active region and includes an oxide aperture. The second reflector is formed above the oxide layer. The circular metal electrode is formed in a circular concave in the second reflector. The circular metal electrode reflects other modes of the laser beam with the plurality of modes except for a fundamental mode and receive an operational voltage. A window exists between the circular concave and lets the laser beam with the fundamental mode pass.

13 Claims, 4 Drawing Sheets

VERTICAL-CAVITY SURFACE EMITTING LASER FOR EMITTING A SINGLE MODE LASER BEAM

BACKGROUND OF THE INVENTION

1. Field of the Invention

The present invention relates to a vertical-cavity surface emitting laser, and particularly to a vertical-cavity surface emitting laser that can emit a single mode laser beam.

2. Description of the Prior Art

In the prior art, a laser beam emitted by a vertical-cavity surface emitting laser (VCSEL) usually includes a plurality of modes, so a divergence angle corresponding to the laser beam emitted by the vertical-cavity surface emitting laser is larger than a divergence angle corresponding to a laser beam emitted by a single mode vertical-cavity surface emitting laser. In optical fiber transmission, a multi-mode vertical-cavity surface emitting laser beam includes a plurality of transverse modes, which lead to severe dispersion loss in fiber transmission, and subsequently reduce the fiber transmission distance. If the dispersion loss in optical fiber transmission is reduced, the transmission distance in optical fiber could be greatly increased. However, a single-mode laser exhibits a much smaller dispersion loss than that of multi-mode laser. Therefore, laser source with little dispersion loss would be well suited for long-distance transmission, that is, a single-mode surface laser(SM VCSEL).

The most common manufacturing method for manufacturing the single mode vertical-cavity surface emitting laser uses a high aluminum-containing layer to limit a laser beam, wherein the manufacturing method makes an oxide aperture of the single mode vertical-cavity surface emitting laser be shrunk below 3 μm. However, when the oxide aperture is too small, the oxide aperture will make a device resistance of the single mode vertical-cavity surface emitting laser be increased and thermal effect more obvious, resulting in the single mode vertical-cavity surface emitting laser generating damping earlier, wherein the damping will reduce efficiency of the single mode vertical-cavity surface emitting laser. Therefore, how to make the oxide aperture larger than 3 μm to overcome the above-mentioned shortcomings of the single mode vertical-cavity surface emitting laser becomes an important issue for a designer of the single mode vertical-cavity surface emitting laser.

SUMMARY OF THE INVENTION

An embodiment of the present invention provides a vertical-cavity surface emitting laser. The vertical-cavity surface emitting laser includes a substrate, a first reflector, an active region, an oxide layer, a second reflector, and a circular metal electrode. The first reflector is formed above the substrate. The active region is formed above the first reflector and includes at least one quantum well, wherein the at least one quantum well generates a laser beam with a plurality of modes. The oxide layer is formed above the active region and includes an oxide aperture. The circular metal electrode is formed in a circular concave in the second reflector, wherein the circular metal electrode is used for reflecting other modes of the plurality of modes of the laser beam except for a fundamental mode of the plurality of modes of the laser beam and receives an operational voltage. A window exists between the circular concave and lets the laser beam with the fundamental mode pass.

In another embodiment of the present invention, the first reflector is an N-type distributed Bragg reflector, and the first reflector is formed by stacking a plurality of N-type low-refractive-index semiconductor materials and a plurality of N-type high-refractive-index semiconductor materials alternately.

In another embodiment of the present invention, the plurality of N-type low-refractive-index semiconductor materials comprises N-type Aluminum gallium arsenide (AlGaAs) or Gallium indium arsenide phosphide(GaInAsP) or Gallium indium arsenide nitride (GaInAsN) or Indium gallium arsenide (InGaAs) or Gallium indium nitride (GaInN) and the plurality of N-type high-refractive-index semiconductor materials comprises N-type Aluminum gallium arsenide (AlGaAs) or Gallium indium arsenide phosphide (GaInAsP) or Gallium indium arsenide nitride (GaInAsN) or Indium gallium arsenide (InGaAs) or Gallium indium nitride (GaInN).

In another embodiment of the present invention, the second reflector is a P-type distributed Bragg reflector, and the second reflector is formed by stacking a plurality of P-type low-refractive-index semiconductor materials and a plurality of P-type high-refractive-index semiconductor materials alternately.

In another embodiment of the present invention, the plurality of P-type low-refractive-index semiconductor materials comprises P-type Aluminum gallium arsenide (AlGaAs) or Gallium indium arsenide phosphide(GaInAsP) or Gallium indium arsenide nitride (GaInAsN) or Indium gallium arsenide (InGaAs) or Gallium indium nitride (GaInN) and the plurality of P-type high-refractive-index semiconductor materials comprises P-type Aluminum gallium arsenide (AlGaAs) or Gallium indium arsenide phosphide (GaInAsP) or Gallium indium arsenide nitride (GaInAsN) or Indium gallium arsenide (InGaAs) or Gallium indium nitride (GaInN).

In another embodiment of the present invention, when the doping concentration of the P-type distributed Bragg reflector is greater than $10^{18}$ atoms/cm$^3$, the circular metal electrode is Gold titanium platinum alloy (TiPtAu); when the of doping concentration of the P-type distributed Bragg reflector is less than $10^{17}$ atoms/cm$^3$, the circular metal electrode is Zinc gold alloy(AuZn).

In another embodiment of the present invention, the substrate is a Gallium arsenide (GaAs) substrate or an Indium phosphide (InP) substrate or an Aluminum gallium arsenide (AlGaAs) substrate or a Silicon (Si) substrate or a Gallium nitride (GaN) substrate.

In another embodiment of the present invention, the at least one quantum well comprises a semiconductor material for generating the laser beam with a plurality of modes, and the semiconductor material comprises Indium gallium arsenide (InGaAs) or Gallium arsenide (GaAs) or Gallium arsenide phosphide (GaAsP) or Gallium indium arsenide nitride (GaInAsN) or Gallium arsenide nitride (GaAsN) or Gallium Arsenide Antimonide (GaAsSb).

In another embodiment of the present invention, width of the window is less than 5 μm.

In another embodiment of the present invention, width of the oxide aperture is between 5 μm and 10 μm.

In another embodiment of the present invention, the oxide layer is an aluminum oxide (AlO$_x$), wherein x is a positive real number.

In another embodiment of the present invention, the laser beam with the fundamental mode is the single mode laser beam.

In another embodiment of the present invention, the at least one quantum well can be replaced by a gain medium, wherein the gain medium comprises at least one quantum dot or a bulk.

The present invention provides a vertical-cavity surface emitting laser for emitting a single mode laser beam. The vertical-cavity surface emitting laser emits a laser beam with a fundamental mode by using the circular metal electrode for reflecting other modes of a laser beam with a plurality of modes except for the fundamental mode. Therefore, compared to the prior art, because the vertical-cavity surface emitting laser includes the circular metal electrode, and an oxide aperture is larger, the present invention can effectively solve the shortcomings that the prior art generates damping earlier and the damping will reduce efficiency of the vertical-cavity surface emitting laser.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
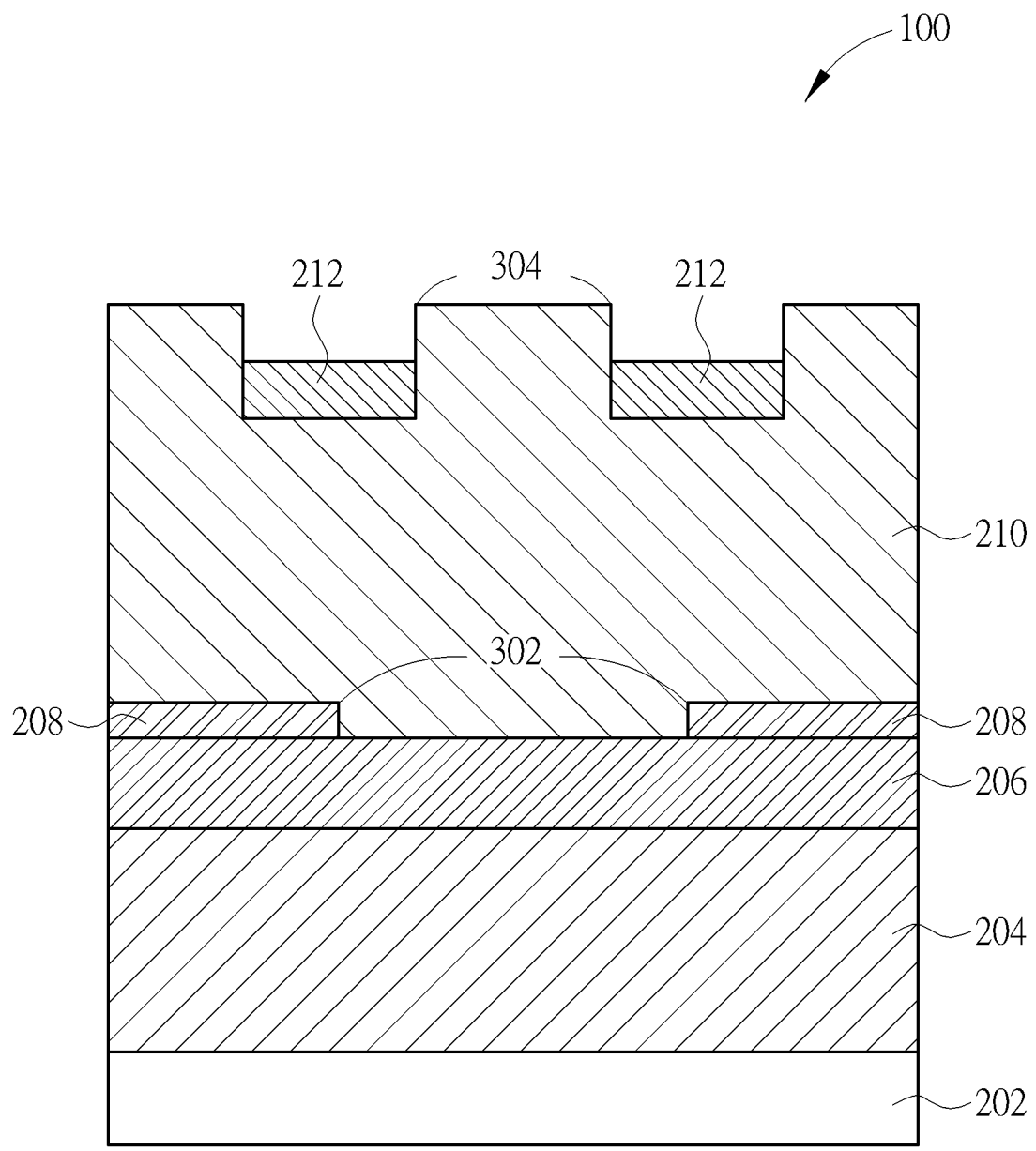
FIG. 1 is a diagram illustrating a vertical-cavity surface emitting laser for emitting a single mode laser beam according to a first embodiment of the present invention.

Please refer to FIG. 1. FIG. 1 is a diagram illustrating a vertical-cavity surface emitting laser 100 for emitting a single mode laser beam according to a first embodiment of the present invention, wherein the vertical-cavity surface emitting laser 100 includes a substrate 202, a first reflector 204, an active region 206, an oxide layer 208, a second reflector 210, and a circular metal electrode 212. The substrate 202 is a Gallium arsenide (GaAs) substrate or an Indium phosphide (InP) substrate or an Aluminum gallium arsenide (AlGaAs) substrate or a Silicon (Si) substrate or a Gallium nitride (GaN) substrate. The first reflector 204 is formed above the substrate 202. The active region 206 is formed above the first reflector 204, and the active region 206 includes at least one quantum well, wherein the at least one quantum well includes a semiconductor material for generating a first laser beam 402 with a plurality of modes, and the semiconductor material is Indium gallium arsenide (InGaAs) or Gallium arsenide (GaAs) or Gallium arsenide phosphide (GaAsP) or Gallium indium arsenide nitride (GaInAsN) or Gallium arsenide nitride (GaAsN) or Gallium Arsenide Antimonide(GaAsSb), and the at least one quantum well can be replaced by a gain medium, wherein the gain medium comprises at least one quantum dot or a bulk. The oxide layer 208 is formed above the active region 206, and the oxide layer 208 includes an oxide aperture 302, wherein width of the oxide aperture 302 is between 5 μm and 10 μm, the oxide layer 208 is an aluminum oxide (AlOx), and x is a positive real number. The second reflector 210 is formed above the oxide layer 208. The circular metal electrode 212 is formed in a circular concave in the second reflector 210, wherein a window 304 exists between the circular concave, wherein width of the window 304 is less than 5 μm.

Figure 2A:
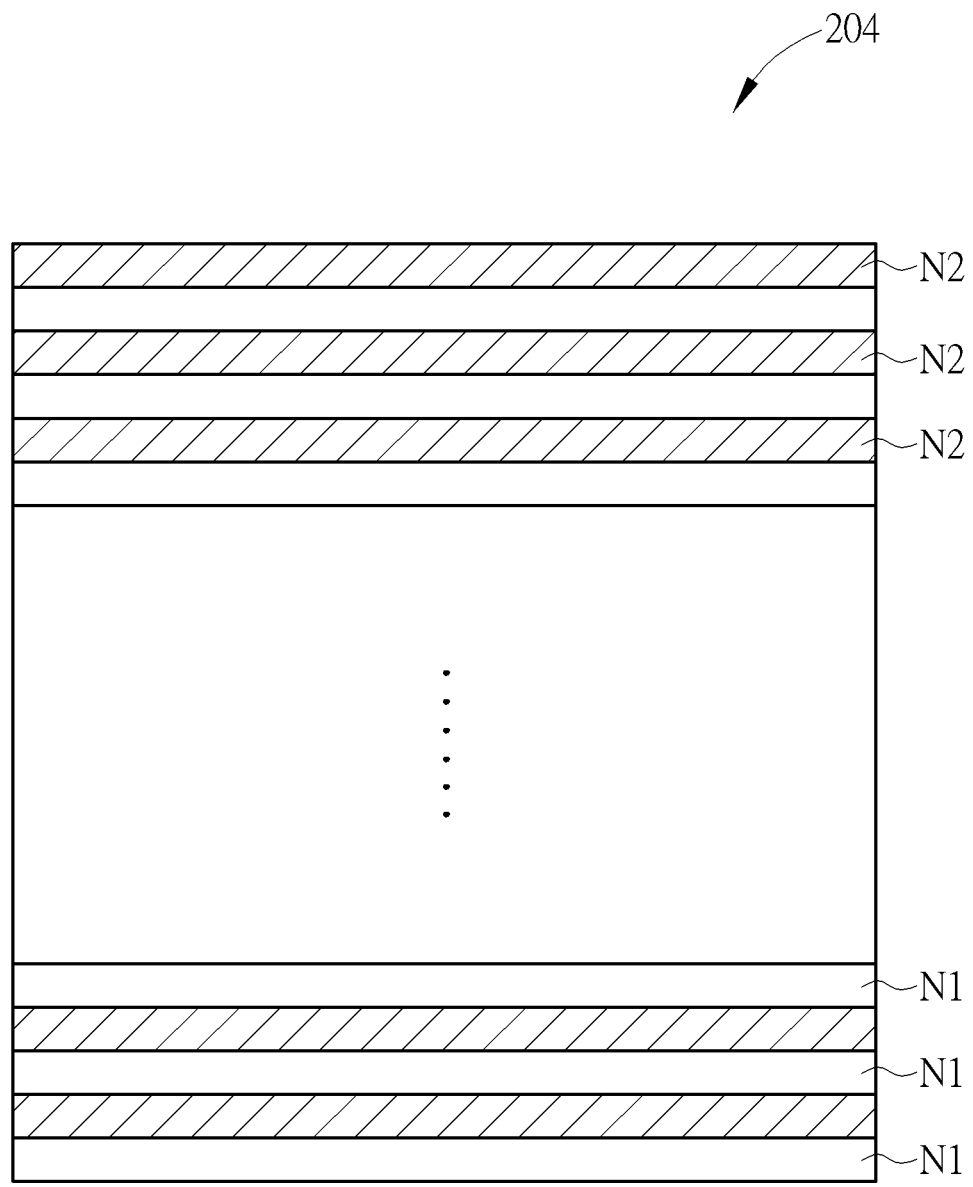
FIG. 2A is a diagram illustrating a structure of a first reflector.
Figure 2B:
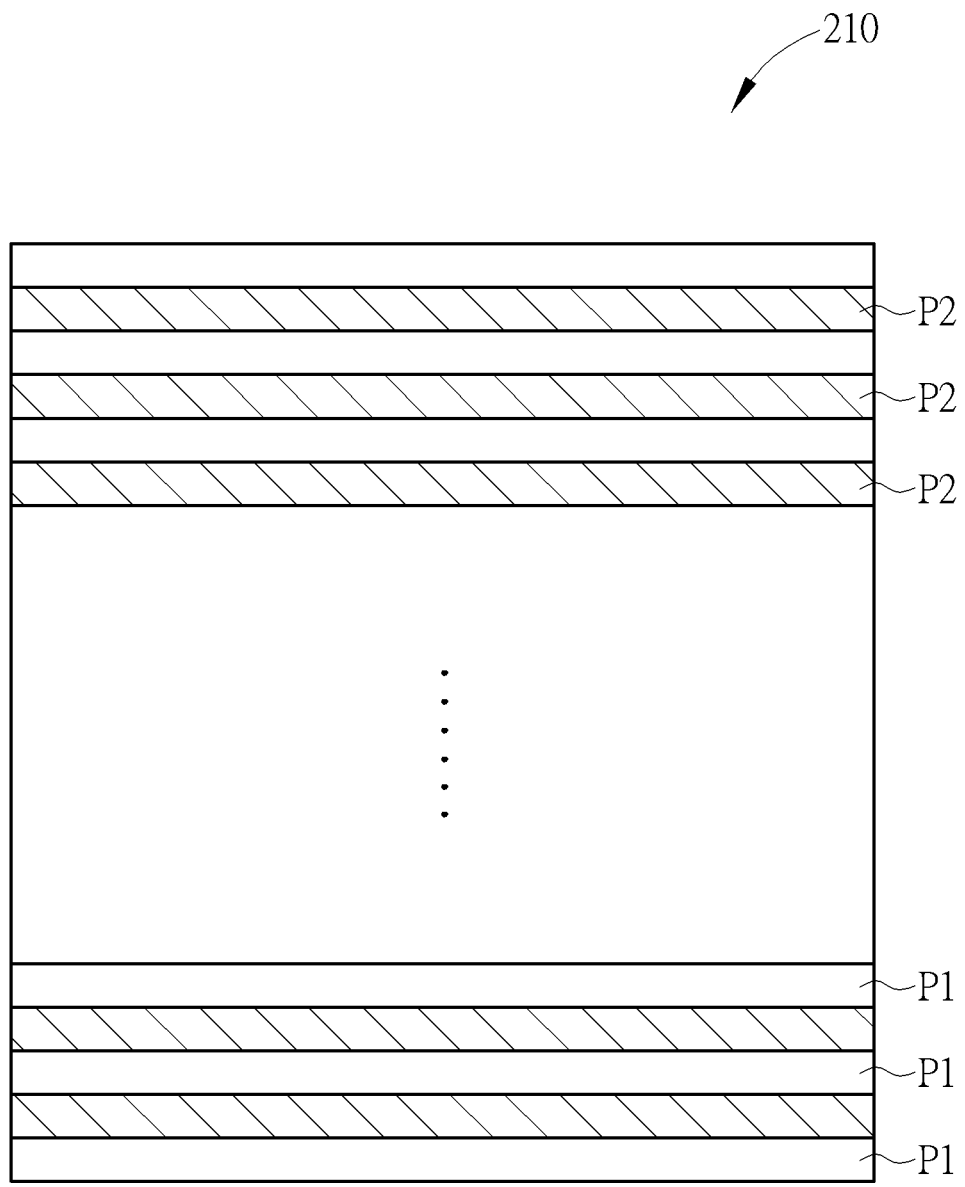
FIG. 2B is a diagram illustrating a structure of a second reflector.

In one embodiment of the present invention, as shown in FIG. 2A, the first reflector 204 is an N-type distributed Bragg reflector, and the first reflector 204 is formed by stacking a plurality of N-type low-refractive-index semiconductor materials N1 and a plurality of N-type high-refractive-index semiconductor materials N2 alternately, wherein the plurality of N-type low-refractive-index semiconductor materials N1 includes N-type AlGaAs or GaInAsP or GaInAsN or InGaAs or GaInN and the plurality of N-type high-refractive-index semiconductor materials N2 includes N-type AlGaAs or GaInAsP or GaInAsN or InGaAs or GaInN. In one embodiment of the present invention, as shown in FIG. 2B, the second reflector 210 is a P-type distributed Bragg reflector, and the second reflector 210 is formed by stacking a plurality of P-type low-refractive-index semiconductor materials P1 and a plurality of P-type high-refractive-index semiconductor materials P2 alternately, wherein the plurality of P-type low-refractive-index semiconductor materials P1 includes P-type AlGaAs or GaInAsP or GaInAsN or InGaAs or GaInN and the plurality of P-type high-refractive-index semiconductor materials P2 includes P-type AlGaAs or GaInAsP or GaInAsN or InGaAs or GaInN. When doping concentration of the P-type distributed Bragg reflector is greater than $10^{18}$ atoms/cm3, the circular metal electrode is Gold titanium platinum alloy (TiPtAu); when the doping concentration of the P-type distributed Bragg reflector is less than $10^{17}$ atoms/cm3, the circular metal electrode is Zinc gold alloy (AuZn).

Figure 3:
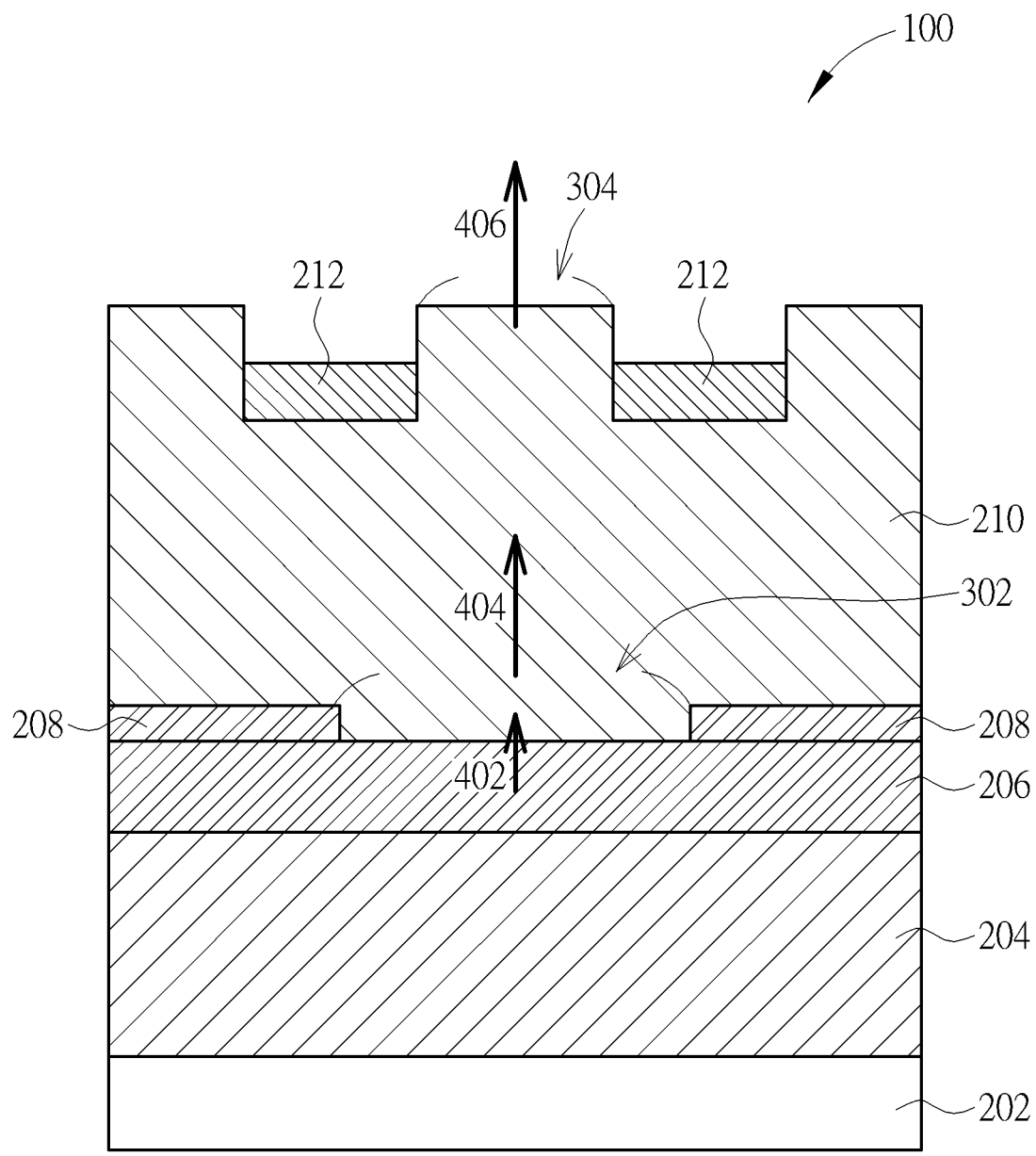
FIG. 3 is a diagram illustrating a vertical-cavity surface emitting laser for emitting a single mode laser beam.

As shown in FIG. 3, the active region 206 utilizes the at least one quantum well to emit the first laser beam 402 with the plurality of modes. When the first laser beam 402 passes through the oxide aperture 302, the oxide layer 208 can limit the first laser beam 402 by first light limitation, and only lets a second laser beam 404 pass the oxide aperture 302, wherein the first light limitation means that the first laser beam 402 cannot pass through the oxide layer 208, but can pass through the oxide aperture 302, and modes of the second laser beam 404 is less than modes of the first laser beam 402. Then, the circular metal electrode 212 can also limit the second laser beam 404 by second light limitation, and the window 304 between the circular metal electrode 212 can let a single mode laser beam 406 pass, wherein the second light limitation is an anti-resonance effect, the anti-resonance effect is used for reflecting other modes of a plurality of modes of the second laser beam 404 except for a fundamental mode of the plurality of modes of the second laser beam 404, the circular metal electrode 212 is further used for receiving an operational voltage, and the single mode laser beam 406 is a laser beam with the fundamental mode. The anti-resonance effect usually means that when etching depth of the circular concave is equal to a quarter wavelength of the single mode laser beam 406, the etching depth will make threshold gain larger. That is to say, the etching depth makes other modes of the plurality of modes of the second laser beam 404 except for the fundamental mode of the plurality of modes of the second laser beam 404 not easily pass through the window 304. However, during the practical etching process, it is very difficult to let the etching depth be equal to the quarter wavelength of the single mode laser beam 406. Therefore, in one embodiment of the present invention, when the etching depth is not equal to the quarter wavelength of the single mode laser beam 406, the circular metal electrode 212 can prevent the other modes of the plurality of modes of the second laser beam 404 except for the fundamental mode of the plurality of modes of the second laser beam 404 from passing through the window 304 by the anti-resonance effect. That is to say, the circular metal electrode 212 can increase tolerance of etching.

To sum up, the vertical-cavity surface emitting laser of the present invention utilizes the circular metal electrode to reflect the other modes of the laser beam except for the fundamental mode of the laser beam to let the laser beam with the fundamental mode emitted. Therefore, compared to the prior art, because the vertical-cavity surface emitting laser includes the circular metal electrode, and the oxide aperture is larger, the present invention can effectively solve the shortcomings of the prior art generating damping earlier and the damping reducing efficiency of the vertical-cavity surface emitting laser.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical-cavity surface emitting laser for emitting a single mode laser beam, comprising:
   a substrate;
   a first reflector formed above the substrate;
   an active region formed above the first reflector and comprising at least one well, wherein the at least one quantum well generates a laser beam with a plurality of modes;
   an oxide layer formed above the active region and comprising an oxide aperture;
   a second reflector formed above the oxide layer; and
   a circular metal electrode formed in circular concave in the second reflector, wherein the circular metal electrode utilizes an anti-resonance effect, reflection effect, or absorption effect to block other modes of the plurality of modes of the laser beam and let a fundamental mode of the plurality of modes of the laser beam pass a window, and receives an operational voltage, and the second reflector does not cover a top surface of the circular metal electrode;
   wherein the window exists between the circular concave, and the circular metal electrode surrounds the window.

2. The vertical-cavity surface emitting laser of claim 1, wherein the first reflector is an N-type distributed Bragg reflector, and the first reflector is formed by stacking a plurality of N-type low-refractive-index semiconductor materials and a plurality of N-type high-refractive-index semiconductor materials alternately.

3. The vertical-cavity surface emitting laser of claim 2, wherein the plurality of N-type low-refractive-index semiconductor materials comprises N-type Aluminum gallium arsenide (AlGaAs) or Gallium indium arsenide phosphide (GaInAsP) or Gallium indium arsenide nitride (GaInAsN) or Indium gallium arsenide (InGaAs) or Gallium indium nitride (GaInN) and the plurality of N-type high-refractive-index semiconductor materials comprises N-type Aluminum gallium arsenide (AlGaAs) or Gallium indium arsenide phosphide(GaInAsP) or Gallium indium arsenide nitride (GaInAsN) or Indium gallium arsenide (InGaAs) or Gallium indium nitride (GaInN).

4. The vertical-cavity surface emitting laser of claim 1, wherein the second reflector is a P-type distributed Bragg reflector and the second reflector is formed by stacking a plurality of P-type low-refractive-index semiconductor materials and a plurality of P-type high-refractive-index semiconductor materials alternately.

5. The vertical-cavity surface emitting laser of claim 4, wherein the plurality of P-type low-refractive-index semiconductor materials comprises P-type Aluminum gallium arsenide (AlGaAs) or Gallium indium arsenide phosphide (GaInAsP) or Gallium indium arsenide nitride (GaInAsN) or Indium gallium arsenide (InGaAs) or Gallium indium nitride (GaInN) and the plurality of P-type high-refractive-index semiconductor materials comprises P-type Aluminum gallium arsenide (AlGaAs) or Gallium indium arsenide phosphide(GaInAsP) or Gallium indium arsenide nitride (GaInAsN) or Indium gallium arsenide (InGaAs) or Gallium indium nitride (GaInN).

6. The vertical-cavity surface emitting laser of claim 4, wherein when doping concentration of the P-type distributed Bragg reflector is greater than $10^{18}$ atoms/cm$^3$, the circular metal electrode is Gold titanium platinum alloy (TiPtAu); when the doping concentration of the P-type distributed Bragg reflector is less than $10^{17}$ atoms/cm$^3$, the circular metal electrode is Zinc gold alloy (AuZn).

7. The vertical-cavity surface emitting laser of claim 1, wherein the substrate is a Gallium arsenide (GaAs) substrate or an Indium phosphide (InP) substrate or an Aluminum gallium arsenide (AlGaAs) substrate or a Silicon (Si) substrate or a Gallium nitride (GaN) substrate.

8. The vertical-cavity surface emitting laser of claim 1, wherein the at least one quantum well comprises a semiconductor material for generating the laser beam with the plurality of modes, and the semiconductor material comprises Indium Gallium arsenide (InGaAs) or Gallium arsenide (GaAs) or Gallium arsenide phosphide (GaAsP) or Gallium indium arsenide nitride (GaInAsN) or Gallium arsenide nitride (GaAsN) or Gallium Arsenide Antimonide (GaAsSb).

9. The vertical-cavity surface emitting laser of claim 1, wherein a width of the window is less than 5 μm.

10. The vertical-cavity surface emitting laser of claim 1, wherein a width of the oxide aperture is between 5 μm and 10 μm.

11. The vertical-cavity surface emitting laser of claim 1, wherein the oxide layer is an aluminum oxide (AlO$_x$), wherein x is a positive real number.

12. The vertical-cavity surface emitting laser of claim 1, wherein the laser beam with the fundamental mode is the single mode laser beam.

13. The vertical-cavity surface emitting laser of claim 1, wherein the at least one quantum well can be replaced by a gain medium, wherein the gain medium comprises at least one quantum dot or a bulk.

* * * * *